United States Patent
Powers

[11] Patent Number: 6,047,480
[45] Date of Patent: Apr. 11, 2000

[54] METHOD OF PROCESSING A SEMICONDUCTOR DEVICE

[75] Inventor: George S. Powers, Austin, Tex.

[73] Assignee: Motorola, Inc., Schaumburg, Ill.

[21] Appl. No.: 09/058,929

[22] Filed: Apr. 13, 1998

[51] Int. Cl.[7] .............................. G01B 7/31; B23Q 3/00
[52] U.S. Cl. ...................... 33/645; 33/613; 414/935
[58] Field of Search .............................. 33/645, 613, 623, 33/626; 414/935, 936

[56] References Cited

U.S. PATENT DOCUMENTS

| | | | |
|---|---|---|---|
| 3,097,434 | 7/1963 | Diamond | 33/645 |
| 4,670,981 | 6/1987 | Kubota et al. | 33/613 |
| 4,700,488 | 10/1987 | Curti | 33/613 |
| 4,805,316 | 2/1989 | Curti | 33/613 |
| 4,934,064 | 6/1990 | Yamaguchi et al. | 33/645 |

*Primary Examiner*—Christopher W. Fulton
*Attorney, Agent, or Firm*—Robert A. Rodriguez; George R. Meyer

[57] ABSTRACT

Alignment of a blade (60) to an electrostatic chuck (53) is accomplished using an alignment tool (30) and an alignment pin (40) to align a port (534) in the electrostatic chuck (53) directly to a hole (602) in the blade (60). Placement of a substrate (70) in a processing chamber (50) is accomplished using a substrate handler configured with the blade (60) to place the substrate (70) accurately on the electrostatic chuck (53). The substrate (70) is then processed in the processing chamber (50) using the electrostatic chuck (53).

20 Claims, 5 Drawing Sheets

METHOD OF PROCESSING A SEMICONDUCTOR DEVICE

FIELD OF THE INVENTION

This invention relates in general to methods of processing semiconductor devices, and more particularly, to methods of processing semiconductor devices using equipment having tight dimensional tolerances.

BACKGROUND OF THE INVENTION

Current processing tools are requiring tighter dimensional tolerances for a number of components. An example of one type of component is an electrostatic chuck used for processing wafers in a plasma. An electrostatic chuck uses an electrostatic potential to secure the wafer to the chamber electrode during wafer processing. The alignment of components responsible for placing and processing the wafer within the processing chamber is highly critical, particularly when using an electrostatic chuck. During an etch or deposition process, slight misplacement of the wafer on the electrostatic chuck can result in nonuniform processing or other undesired effects. Additionally, the misalignment of the substrate on the electrostatic chuck can result in excessive leaking of a backside coolant gas and cause a fault condition to occur that prematurely terminates processing.

The prior art uses a variety of alignment schemes attempting to achieve the tight alignment tolerances required by electrostatic chucks. In one aligning scheme, a metal wafer with a hole in the center is placed onto a substrate handler. The metal wafer is then visually aligned to a gas port located within the electrostatic chuck. This alignment is subject to inaccuracies because it is a visual technique, and the results are highly variable.

In yet another embodiment, an aligning tool or jig can be used to perform the alignment. For example, the Applied Materials 5300 Centura™ platform, manufactured by Applied Materials, Inc. of Santa Clara, Calif., uses an alignment tool similar to the one shown in FIG. 1. The alignment tool 10 includes a ring 12 with a raised portion 14 having a hole 16 through the center. After the alignment tool is aligned to the electrostatic chuck (not shown), a substrate handler (not shown) is inserted into a portion of the alignment tool 10. A pin 20, as illustrated in FIG. 2, is inserted through hole 16 in the alignment tool 10 and through a hole in the substrate handler. Once the shaft 22 of the pin 20 falls through the hole in the substrate handler, the system is aligned. As shown in FIG. 2, the shaft of the pin 20 is of relatively constant width from the shoulder of the tool 24 downward.

Problems can be encountered with this alignment scheme. The alignment of the tool 10 to the chuck is performed by snugly placing the inner diameter of ring 12 along the outer diameter of the electrostatic chuck. Because the alignment is circumference to circumference, any deviation or machining tolerance variations along the diameter of either surface can be problematic. Since the alignment tool 10 is portable and is frequently moved, the ring 12 is susceptible to physical damage and deformation from being dropped or mishandled, or as a result of exposure to extreme temperatures.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Alignment of a substrate handier to an electrostatic chuck is accomplished using an alignment tool and an alignment pin to align a reference point on the electrostatic chuck directly to a reference point on the substrate handler. Placement of a substrate into a processing chamber is accomplished using the substrate handler to place the substrate accurately on the electrostatic chuck. The substrate is then processed in the processing chamber using the electrostatic chuck.

Figure 3:
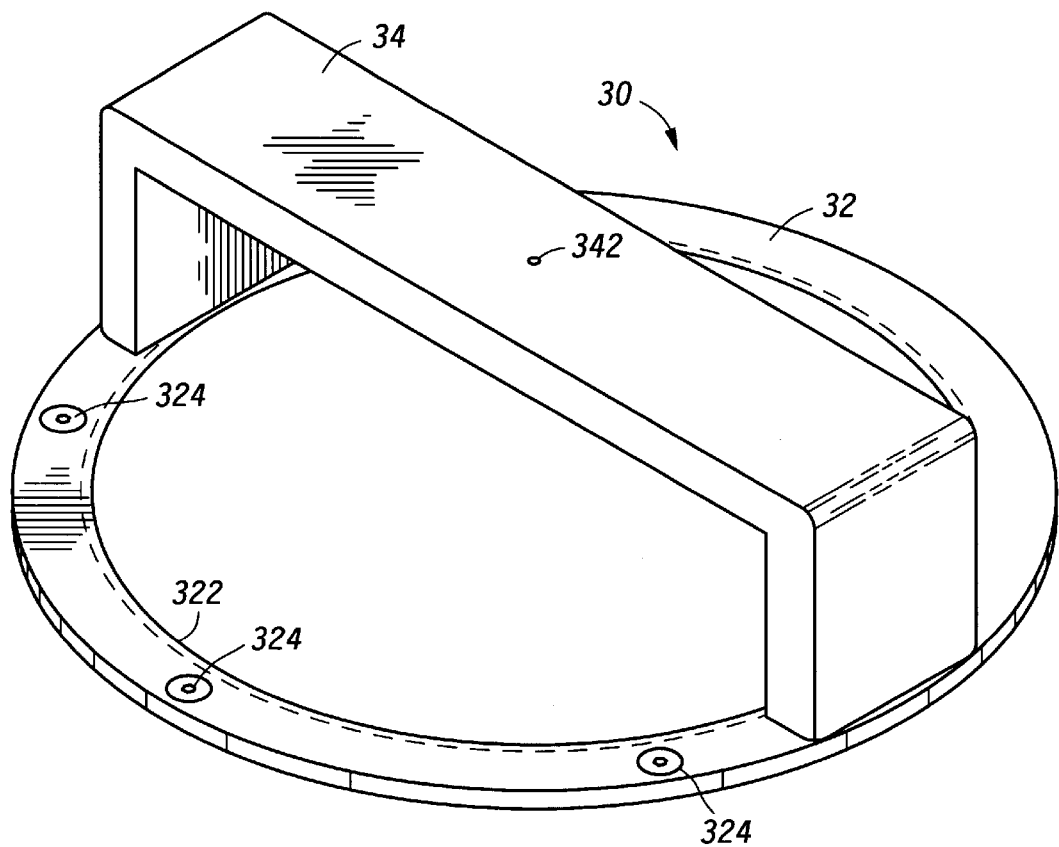
FIG. 3 includes an illustration of a perspective view of an alignment tool in accordance with one embodiment of the present invention.

FIG. 3 includes a perspective view of an alignment tool 30 that can be used with an Applied Materials 5200 Centura™ platform, which has an electrostatic chuck (not shown) requiring very tight alignment tolerances. In one particular case, tolerances should be maintained within approximately 1.3 mm (0.05 inches) of the specified dimensions. The alignment tool 30 includes a plastic annular ring 32 to prevent the alignment tool 30 from scratching the electrostatic chuck 53. The annular ring 32 has an inner beveled edge 322 that allows it to fit snugly against a portion of the electrostatic chuck that does not contact the substrate (not shown) during processing. This allows the alignment to occur without damaging the substrate contacting surface of the electrostatic chuck.

In one particular embodiment of the present invention, three pegs 324 are located along annular ring 32. The pegs help to guide the alignment tool into corresponding recessions (not shown) near the outer edge of the electrostatic chuck. In this particular embodiment, the electrostatic chuck is held in place with 12 bolts (not shown) that are spaced substantially equal distances apart in the recessed holes along the radius of the chuck. The bolts are recessed within the openings to form the recessions. Although the pegs 324 are not required, they provide a consistent point of reference for the alignment tool, allowing it to be securely placed over the electrostatic chuck, and prevent it from rotating.

A bridge 34 is attached to the annular ring 32 and extends over the electrostatic chuck. The bridge 34 is constructed from a metallic material, although this is not a requirement of the present invention. During alignment, the bridge 34 overlies a substrate handler (not shown). A hole 342 is located in the center of the bridge and allows the alignment tool 30 to align the substrate handler directly to a gas port in the electrostatic chuck.

Figure 2:
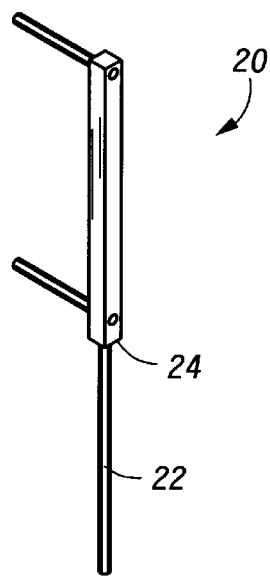
FIG. 2 includes an illustration of a perspective view of a prior art alignment pin.
Figure 4:
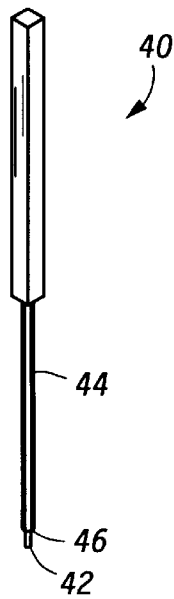
FIG. 4 includes an illustration of a perspective view of an alignment pin in accordance with an embodiment of the present invention.

FIG. 4 includes an illustration of the alignment pin 40 used in this particular embodiment. As can be seen, its shape is similar to the alignment pin 20 used in FIG. 2. However, unlike the alignment pin 20 in FIG. 2, the tip 42 (distal portion) of the alignment pin has a narrower width compared to the shaft (intermediate portion) 44. This configuration allows the distal portion 42 to be inserted within a gas port (not shown) of an electrostatic chuck (not shown). In this particular embodiment, the pin 40 has shoulders 46 that allow it to rest on the electrostatic chuck surface. In an alternate embodiment, the shape of the tip 42 could be changed to include a tapered end that is smaller in width than the shaft 44. The tapering can be discrete or continuous, or any combination of discrete and continuous. The tip 42 of the alignment pin 40 fits within the gas port of the electrostatic chuck. The alignment of the substrate handler (not shown) to the electrostatic chuck is improved because the width of the tip 42 approximates the width of the gas port.

Figure 5:
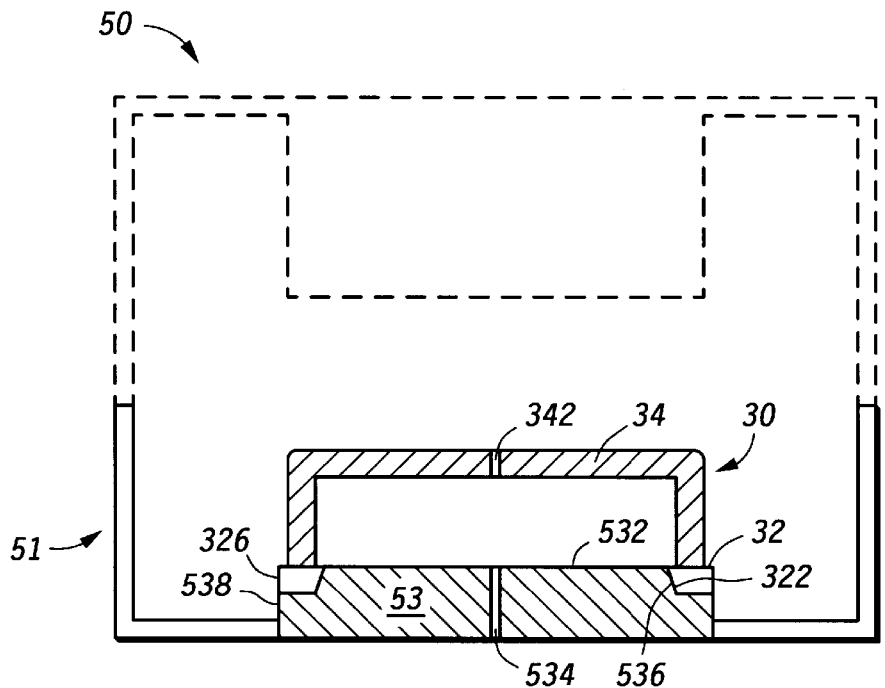
FIG. 5 includes an illustration of cross-sectional view of a portion of a processing chamber having the alignment tool placed over an electrostatic chuck.

An alignment procedure is described using alignment tool 30 and alignment pin 40 as illustrated in FIGS. 3 and 4. In FIG. 5, a portion of a processing chamber 50 is illustrated. The solid lines of the figure represent the lower portion 51 of the processing chamber 50. The dashed lines represent the upper portion of the processing chamber 50 and indicate the upper portion has been removed. The alignment tool 30 is placed such that the beveled edge 322 of the annular ring 32 contacts the beveled edge 536 of an electrostatic chuck 53. The top surface of the annular ring 32 is substantially flush with the top surface 532 of the electrostatic chuck 53, and the outer edge 326 of the alignment tool 30 is substantially in line with the outer edge 538 of the electrostatic chuck 53. Recessed holes (not shown) near the perimeter of the electrostatic chuck are used to align the pegs 324 (not shown in FIG. 5) of the alignment tool 30 to the electrostatic chuck 53. The pegs 324 are designed to fit within specific recessed holes.

Figure 1:
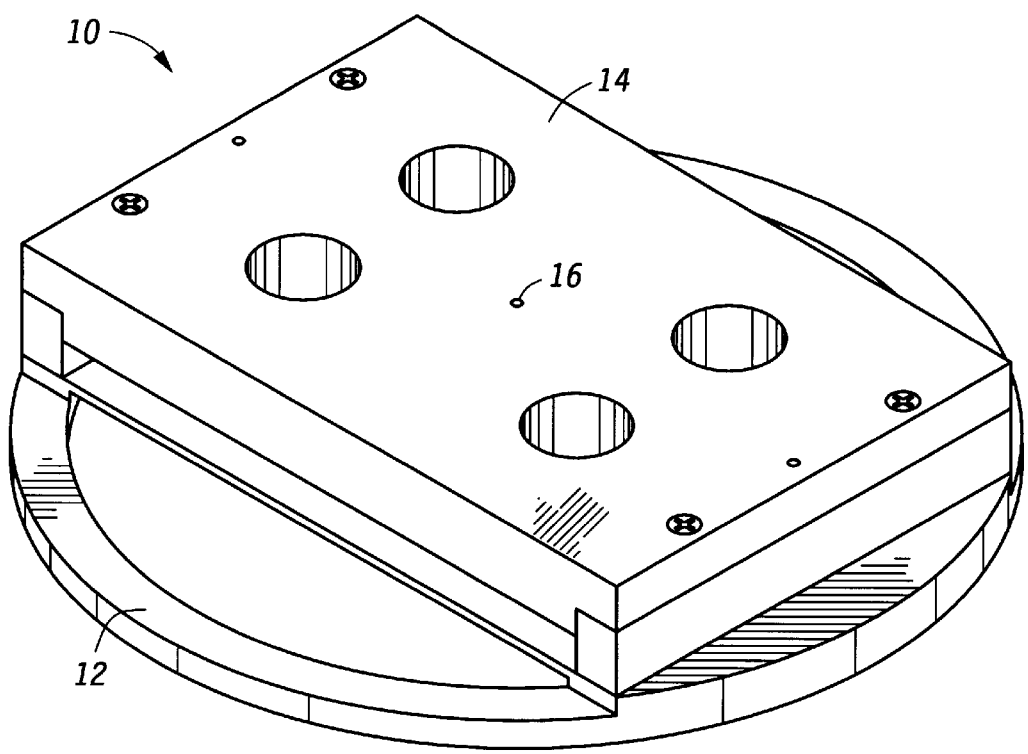
FIG. 1 includes an illustration of a perspective view of a prior art alignment tool.
Figure 6:
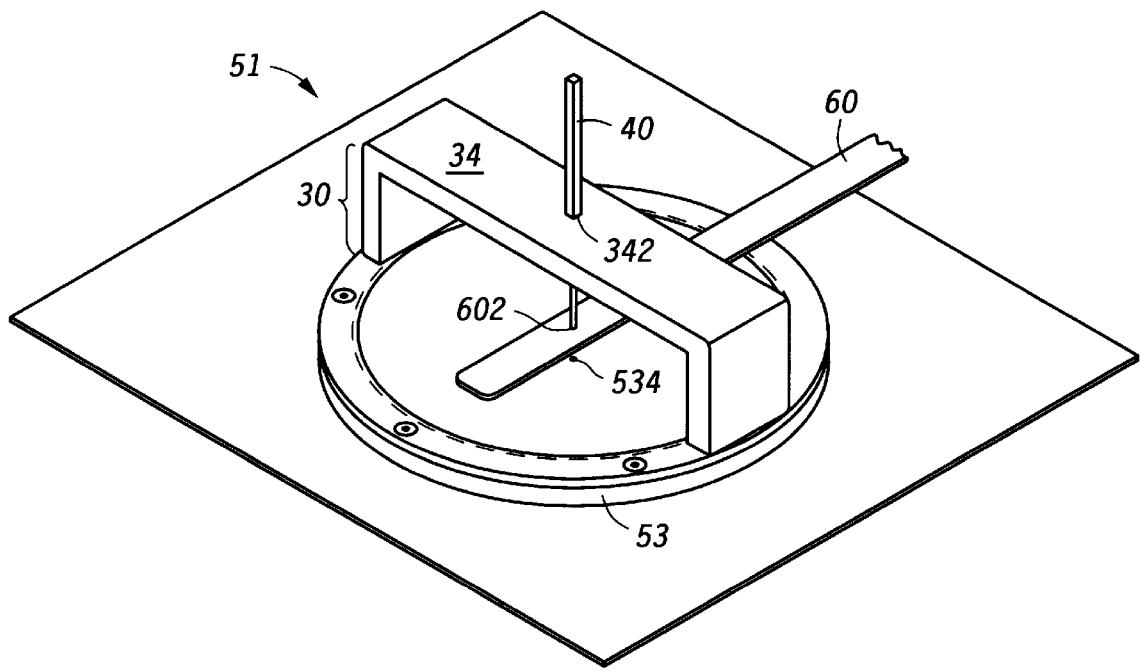
FIG. 6 includes an illustration of a perspective view of the processing chamber in FIG. 5 during an alignment step in accordance with an embodiment of the present invention.

FIG. 6 includes a perspective view of the lower portion 51 of processing chamber 50. During the alignment, a blade 60, which is part of a substrate handler (not shown), is inserted into the lower portion 51 of the processing chamber 50. After the alignment tool 30 is placed on the electrostatic chuck 53, the hole 602 in the blade 60 is aligned to the gas port 534 in electrostatic chuck 53 using the alignment tool 30. The alignment is achieved by inserting the alignment pin 40, through the hole 342 in bridge 34, through the hole 602 in the substrate blade 60, and into the gas port 534 in the electrostatic chuck. The holes 342, 602 and 534 are reference points used during the alignment. Only the smaller width tip (not shown in FIG. 6) of the pin 40 extends into the gas port 534 of electrostatic chuck 53. When this occurs, the system has been aligned such that the substrate blade 60 is directly aligned to the gas port 534 in the electrostatic chuck 53. Therefore, there is no additional tolerance that would occur when two separate steps of aligning are performed, such as when using alignment tool 10 in FIG. 1, which first positioned the alignment tool 10 to the electrostatic chuck 53, and then aligned the substrate blade 60 to the alignment tool 10. The position of the substrate blade 60 is then programmed or otherwise set such that any time the blade 60 is extended into processing chamber 50, it will go to virtually the same position every time and ensure proper placement of the substrate onto the electrostatic chuck 53. At this point the alignment is complete.

Figure 7:
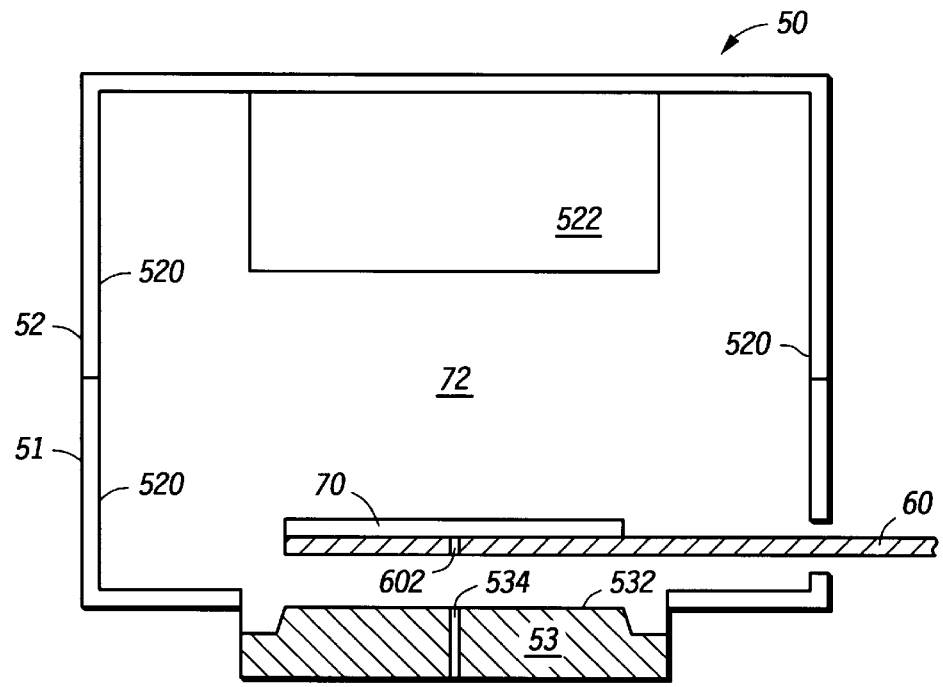
FIG. 7 includes a cross-sectional view of a portion of the processing chamber during the loading of a semiconductor device substrate.

After completing the alignment, processing of semiconductor device substrates is performed as illustrated in FIGS. 7–10. In FIG. 7, a semiconductor device substrate 70 is loaded within the processing chamber 50. The processing chamber 50 includes the lower portion 51 that has previously been described and now includes the upper portion 52 that has been installed over the lower portion 51. The upper portion 52 includes the processing chamber walls 520 and a control unit 522. The control unit 522 includes inlets for gasses to be fed within the processing chamber 50 and electronics for striking a plasma.

During processing, the door (which is not illustrated in FIG. 7) is opened and the substrate blade 60 is then inserted with the semiconductor device substrate 70 in place. The chuck 53 is recessed during the loading operation, to allow the blade 60 to be inserted into the processing chamber system. The hole 602 is essentially overlying and in line with the gas port 534 of the processing chamber 50. The semiconductor device substrate 70 is transferred onto the surface 532 of the chuck 53 by way of lift pins (not shown) in the chuck. The chuck 53 is then raised, and the door is closed to seal the system. Because the substrate blade 60 has been accurately aligned to the chuck 53, the semiconductor device substrate 70 is precisely placed on the electrostatic chuck 53. This ensures proper processing of the substrate 70 during a subsequent processing step.

Figure 8:
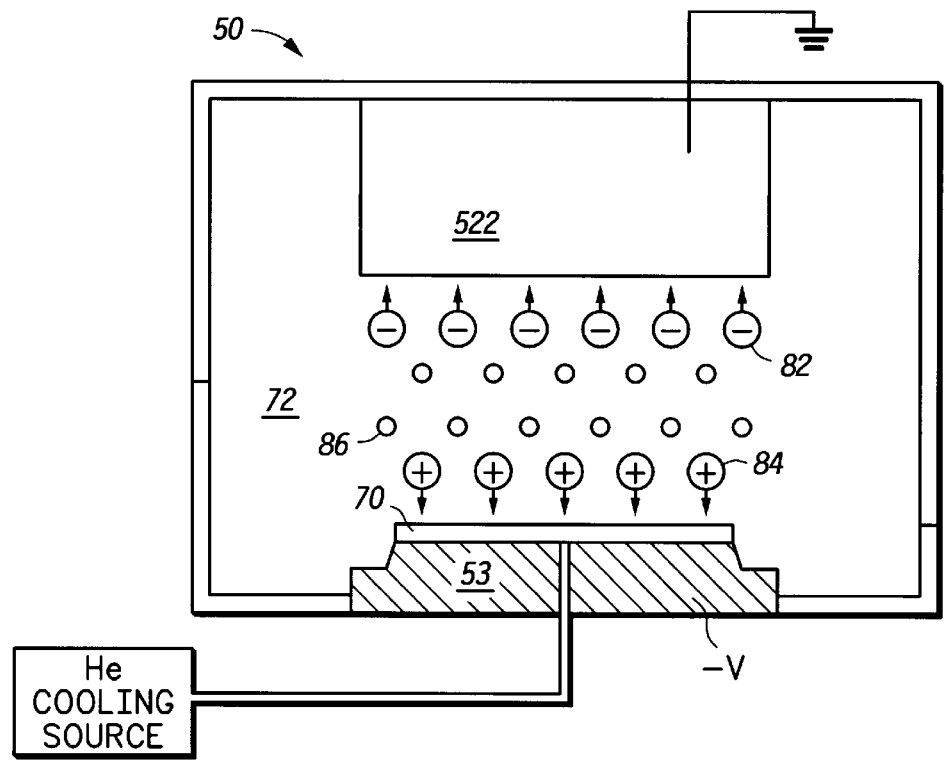
FIG. 8 includes an illustration of a cross-sectional view of the processing chamber during a plasma processing step.

Actual processing of the wafer is performed as illustrated in FIG. 8. In one embodiment, an etch process is performed to pattern a polysilicon layer. After the substrate 70 has been placed in the processing chamber, the processing chamber is sealed and an electrostatic potential is applied to secure the substrate 70 to the electrostatic chuck 53. Helium (He) gas flows to the electrostatic chuck to cool the backside of the substrate 70. The processing chamber 50 is evacuated to a pressure of approximately 75 millitorr, and molecular chlorine ($Cl_2$) and hydrogen bromide (HBr) gases are flowed into the processing chamber 50, each in a range of approximately 85 to 95 standard cubic centimeters per minute (sccm). After achieving the proper pressure and gas flow rate operating conditions, a 500 watt (W) electrical field is applied between the control unit 522 and a lower electrode (not shown).

The electrical field partially disassociates the gas molecules to produce a plasma composed of ions 84, electrons 82, and a variety of neutral species including molecules, atoms and free radicals 86. The free radicals 86, are electrically neutral but exist in a state of incomplete chemical bonding, making them very reactive. The free radicals 86 diffuse through the gas to the surface of the substrate 70 where they are adsorbed and react with the polysilicon layer to form a volatile by-product. The resulting by-product desorbes from the surface of the substrate and diffuses into the bulk of the gas. Positively charged ions 84 are attracted to the negatively biased lower electrode where they strike the polysilicon surface material and enhance the etching process. Electrons 82 formed during the reaction are attracted to the oppositely biased control unit 522. This reaction continues until the layer has been completely etched. Once processing is completed, the reaction is terminated, and the substrate 70 is removed from the processing chamber 50 in a reverse procedure of that described in FIG. 7.

Figure 9:
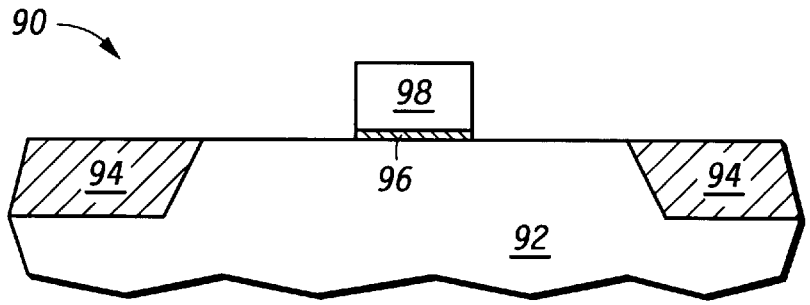
FIG. 9 includes an illustration of a cross-sectional view of a portion of a semiconductor device substrate after performing a plasma etching step.
Figure 10:
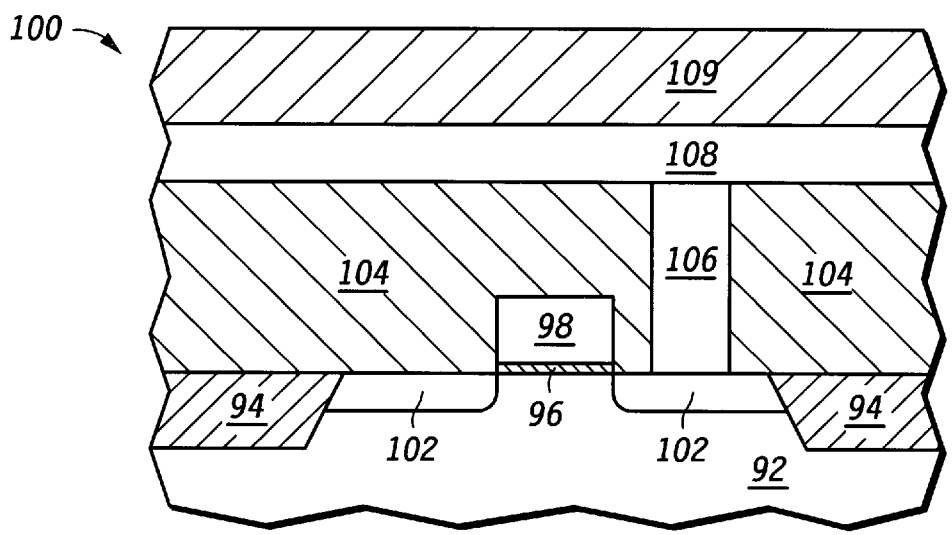
FIG. 10 includes an illustration of a cross-sectional view of the substrate in FIG. 9 after forming a substantially completed device.

FIG. 9 illustrates a partially completed semiconductor device 90 that has been etched using this process. Included in FIG. 9 are a semiconductor device substrate 92, field isolation regions 94, a gate dielectric layer 96, and a gate electrode 98 formed from the patterned polysilicon layer. Processing of the substrate continues to form a substantially completed semiconductor device 100 as shown in FIG. 10. The semiconductor device 100 includes doped regions 102, an interlevel dielectric layer 104, a contact plug 106, an interconnect 108, and a passivation layer 109.

Clearly, the present invention is not limited to the embodiment just previously given. In addition to using the alignment tool 30 for electrostatic chucks, it can be used to align almost any type of chuck. Electrostatic chucks are particularly sensitive to tolerances and require a highly precise alignment. The tolerance is usually no more than approximately 0.6 mm (0.024 inches), and typically is less than approximately 0.2 mm (0.008 inches). The alignment precision achieved can be extended to other pieces of equipment including ion implanters, sputtering chambers, resist coaters, and other single substrate processing systems. In addition to being used for plasma etch, this alignment procedure will generally be quite useful anytime an electrostatic chuck is used, such as plasma depositions for various oxides, nitrides and some metal layers.

Figure 11:
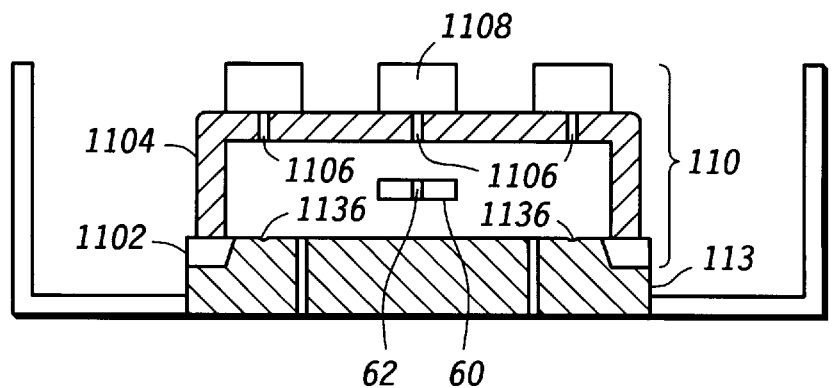
FIG. 11 includes an illustration of a cross-sectional view of an alternate embodiment of an alignment tool using a different aligning scheme in accordance with yet another embodiment of the present invention.

The alignment tool 30 and alignment procedure can be modified. FIG. 11 includes an illustration of an alternate embodiment. In this particular embodiment, the alignment tool 110 includes an annular ring 1102 and the bridge 1104. In this particular instance, the bridge has three alignment holes 1106, that are positioned relative to the chuck 113. In addition, instead of using mechanical pins, other alignment controllers 1108 can be used. More particularly, radiation, such as light, can be directed from controllers 1108 through the holes 1106 to reference points such as features 1136 along the surface of the chuck 113. The features 1136 are dimples within the surface of the chuck 113 and are spaced at least approximately 1.0 mm from the outer most edge of the chuck. Therefore, the alignment is not occurring by the mere fact that the annular ring sits around the chuck itself. Once the reflection from those points is proper, the alignment of the tool 110 to the chuck has been achieved. The blade 60 is then inserted into the system. The middle radiation controller 1108 then directs radiation through the opening 1106 to align the hole 602 in the blade 60. After simultaneous alignment of the alignment tool 110 to the chuck 113 and the blade 60 has been achieved, the alignment is complete. The aligning procedure can be completely automated.

Embodiments include benefits over the prior art systems. In the embodiments of this invention, the alignment tool 30 can be made using commercially available materials and precise machining tools to create the alignment tool 30. The procedure required to perform the alignment is relatively simple and can either be using software or can be done using a combination of automated and manual processing steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Further advantages and benefits of specific embodiments should not be construed to apply to those particular embodiments, and any particlular advantage or benefit should not be construed as an essential element for any or all the claims. In the claims, means-plus-function clause(s), if any, cover the structures described herein that perform the recited function(s). The mean-plus-function clause(s) also cover structural equivalents and equivalent structures that perform the recited function(s).

I claim:

1. A method for processing a semiconductor device comprising the steps of:

placing an alignment tool over a chuck within a processing chamber, wherein the chuck is capable of receiving a substrate via a delivery structure;

aligning a first reference point on the chuck with a second reference point on the alignment tool and a third reference point on a delivery structure, the first reference point being spaced apart from an edge of the chuck;

removing the alignment tool from the processing chamber;

inserting a substrate in the processing chamber using the delivery structure after the step of aligning; and processing the substrate within the processing chamber.

2. The method of claim 1, wherein the step of aligning further comprises a step of:

simultaneously aligning the first reference point, the second reference point, and the third reference point to one another using an alignment pin, the alignment pin having a distal section with a distal width and an intermediate section with an intermediate width, the distal width being smaller than the intermediate width.

3. The method of claim 1, wherein the step of aligning further comprises a step of:

using a radiation source to align the first reference point, the second reference point, and the third reference point to one another.

4. The method of claim 1, wherein the delivery structure is a software controlled substrate handler.

5. The method of claim 1, wherein the delivery structure further comprises a blade structure for placement of the substrate onto the chuck.

6. The method of claim 1, wherein the chuck further comprises an electrostatic chuck having at least one port for providing a cooling gas to a surface of the substrate, the at least one port being the first reference point.

7. The method of claim 1, wherein the alignment tool further comprises:

an annular ring; and an attached bridge which spans two arcing sections of the annular ring, wherein the second reference point is located on the attached bridge.

8. The method of claim 7, wherein the second reference point is substantially in a center of the attached bridge and is a through-hole.

9. The method of claim 7, wherein the alignment tool further comprises holes in the annular ring and a peg is attached to the annular ring at each of the holes, each peg aligns to a corresponding recession in the chuck.

10. A method of processing a semiconductor device in a processing chamber that has been previously aligned by aligning a first reference point on an alignment tool to a second reference point on a chuck in the processing chamber, wherein the second reference point includes a gas port in the chuck, the second reference point being spaced apart from an outer edge of the chuck, the method including the steps of inserting a substrate into the processing chamber using a delivery structure, and processing the substrate within the processing chamber.

11. The method of claim 10, wherein the second reference point includes a recessed region in the chuck.

12. The method of claim 10, further comprising a third reference point on the delivery structure, wherein the first, second and third reference points have been aligned substantially along a same axis.

13. The method of claim 10, further comprising using a third reference point on the delivery structure and a fourth reference point on the alignment tool, the fourth reference point being spaced apart from the first reference point, the third reference point having been aligned to the fourth reference point along a second axis.

14. The method of claim 13, wherein the first reference point has been aligned to the second reference point along a first axis simultaneously with the third reference point having been aligned to fourth reference point along the second axis.

15. The method of claim 10, wherein the step of processing further comprises a step of flowing a gas into the gas port while the substrate is in contact with the chuck.

16. The method of claim 15, wherein the step of flowing comprises flowing a helium gas, wherein the helium gas has:

a substrate backside helium pressure of in a range of approximately 7–10 torr; and a helium leak rate into the processing chamber that does not exceed approximately four standard cubic centimeters per minute over any 10 second time interval during the step of flowing the helium gas.

17. The method of claim 10, further comprising the steps of:

forming an interconnect layer over the substrate; and forming a passivation layer over the interconnect layer.

18. A method for processing a semiconductor device, comprising the steps of:

placing an alignment tool in a processing chamber, wherein the processing chamber has a chuck within a processing chamber, wherein the chuck is capable of receiving a substrate via a delivery structure;

aligning a first reference point on the chuck with a second reference point on the alignment tool, the first reference point being spaced apart from an outer edge of the chuck;

aligning a third reference point on the chuck with a fourth reference point on the alignment tool, the third reference point being spaced apart from an edge of the chuck, and the fourth reference point being spaced apart from the second reference point;

aligning a fifth reference point on the alignment tool with a sixth reference point on a delivery structure, the fifth reference point being spaced apart from the second reference point and the fourth reference point;

removing the alignment tool from the processing chamber;

inserting the substrate into the processing chamber using the delivery structure after the step of aligning; and processing the substrate through the processing chamber.

19. The method of claim 18, wherein the first and third reference points are selected from the group consisting of recessed regions and gas ports.

20. The method of claim 18, wherein the alignment of the first reference point to the second reference point and the third reference point to the fourth reference point occur simultaneously with the alignment of the fifth reference point to the sixth reference point.

* * * * *